(12) United States Patent
Sugie

(10) Patent No.: US 12,712,541 B2
(45) Date of Patent: Aug. 18, 2026

(54) GATE DRIVER CIRCUIT

(71) Applicant: ROHM CO., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 31 days.

(21) Appl. No.: 18/888,754

(22) Filed: Sep. 18, 2024

(65) Prior Publication Data

US 2025/0105836 A1 Mar. 27, 2025

(30) Foreign Application Priority Data

Sep. 22, 2023 (JP) ................................ 2023-159107

(51) Int. Cl.
*H03K 17/16* (2006.01)

(52) U.S. Cl.
CPC ... *H03K 17/165* (2013.01); *H03K 2217/0027* (2013.01)

(58) Field of Classification Search
CPC .................... H03K 17/165; H03K 2217/0027
USPC ........................................................ 327/108
See application file for complete search history.

(56) References Cited

U.S. PATENT DOCUMENTS 9,419,615 B2 * 8/2016 Hsu ................ H03K 19/017509
11,211,927 B2 * 12/2021 Sugie ............... H03K 17/04206
2020/0185910 A1 * 6/2020 Cremers ............... H02H 9/001
2021/0105013 A1 * 4/2021 Sugie ................... H03K 17/687
2022/0302839 A1 * 9/2022 Ishino ....................... G05F 3/26
2024/0113614 A1 * 4/2024 Sugie .................. H02M 7/5387
2025/0015798 A1 * 1/2025 Sugie ...................... H02P 27/00
2025/0105836 A1 * 3/2025 Sugie .................. H03K 17/165
2025/0105840 A1 * 3/2025 Sugie ................ H03K 17/6871

FOREIGN PATENT DOCUMENTS

JP 2018082575 A 5/2018

* cited by examiner

*Primary Examiner* — Ryan Jager
(74) *Attorney, Agent, or Firm* — CANTOR COLBURN LLP

(57) ABSTRACT

A first current source is configured to generate a first current switchable between a first current amount and a second current amount less than the first current amount. A first current mirror circuit has an input node to which the first current source is connected and is configured to fold and supply the first current to a gate of a power transistor. An on-fixing switch is connected between the gate of the power transistor and a high-level line in which a high voltage equivalent to a high level of a gate voltage of the power transistor is generated. A control circuit is configured to control the on-fixing switch and the first current source.

17 Claims, 10 Drawing Sheets

GATE DRIVER CIRCUIT

CROSS REFERENCE TO RELATED APPLICATIONS

The present invention claims priority under 35 U.S.C. § 119 to Japanese Application No. 2023-159107, filed on Sep. 22, 2023, the entire contents of which being incorporated herein by reference.

BACKGROUND

1. Technical Field

The present disclosure relates to a gate driver circuit.

2. Description of the Related Art

In motor driver circuits, DC/DC converters, power conversion devices, and the like, half-bridge circuits, H-bridge circuits, and three-phase bridge circuits (hereinafter collectively referred to as bridge circuits) using power transistors have been widely used.

FIG. 1 is a circuit diagram of a bridge circuit 10. The bridge circuit 10 includes an upper arm 12 and a lower arm 14 disposed in series between a power supply terminal and a ground terminal. The upper arm 12 includes a high-side transistor MH and a flywheel diode Di, which are connected in parallel. The lower arm 14 includes a low-side transistor ML and a flywheel diode Di, which are connected in parallel. An inductor (coil) L1, which is a load, is connected to an output terminal of the bridge circuit 10.

The bridge circuit 10 can be in a state (high impedance state) φ1 in which both the high-side transistor MH and the low-side transistor ML are off, a state (high output state) φ2 in which the high-side transistor MH is on and the low-side transistor ML is off, or a state (low output state) φ3 in which the high-side transistor MH is off and the low-side transistor ML is on. For each of the states φ1 to φ3, there are a current source state in which an electric current $I_{OUT}$ is discharged from the bridge circuit 10 (flow rightward in the figure) and a current sink state in which the bridge circuit 10 sucks the current $I_{OUT}$ (flow leftward in the figure).

As a result of examining the bridge circuit in FIG. 1, the present disclosers have come to recognize the following problems.

In the current source state, transition from the high-impedance state φ1 to the high-output state φ2 is considered. In the state φ1, the output current $I_{OUT}$ is supplied to the load via the flywheel diode Di of the lower arm 14 (current source). An output voltage $V_{OUT}$ in the state φ1 is $-V_F$. The $V_F$ is a forward voltage of the flywheel diode Di.

In the state φ2, the output current $I_{OUT}$ of the bridge circuit 10 flows through the high-side transistor MH. Further, a reverse recovery current $I_{rc}$ flows from a cathode to an anode of the flywheel diode Di of the lower arm 14 on the opposite side. Accordingly, both the output current $I_{OUT}$ and the reverse recovery current Ire flow through the high-side transistor MH. This state is equivalent to flowing of a through current. If the through current flows, the output voltage $V_{OUT}$ of the bridge circuit 10 becomes unstable, resulting in ringing. The ringing is not preferable because of unnecessary radiation.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Overview of Embodiments

Figure 1:
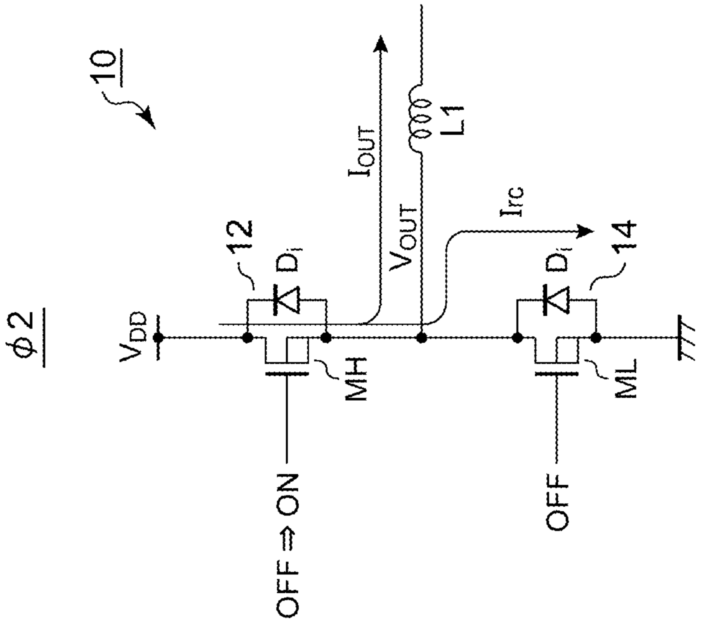
FIG. 1 is a circuit diagram of a bridge circuit.
Figure 1:
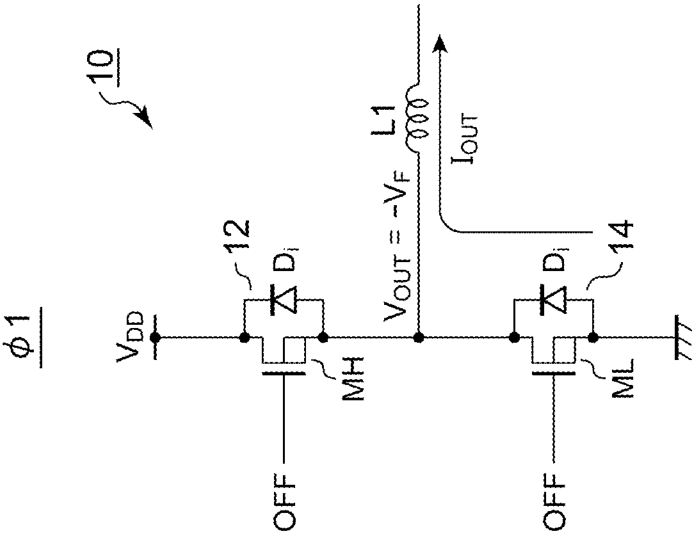

An overview of some exemplary embodiments of the present disclosure will be described. This overview is to describe some concepts of one or more embodiments in a simplified manner for the purpose of basic understanding of the embodiments as a prelude to the detailed description to be described later and does not limit the breadth of the invention or disclosure. For convenience, "one embodiment" may be used to refer to one embodiment (example or modification) or a plurality of embodiments (examples or modifications) disclosed in the present description.

This overview is not a comprehensive overview of all possible embodiments and is not intended to specify key elements of all the embodiments or delineate the scope of some or all aspects. The sole purpose of the overview is to present some concepts of one or more embodiments in a simplified form as a prelude to the more detailed description to be presented later.

The gate driver circuit according to an embodiment drives an N-type power transistor constituting the switching circuit. The gate driver circuit includes a turn-on circuit configured to source an electric current to a gate of the power transistor, a turn-off circuit configured to sink an electric current from the gate of the power transistor, and a control circuit that controls the turn-on circuit and the turn-off circuit. The turn-on circuit includes: a first current source configured to generate a first current switchable between a first current amount and a second current amount less than the first current amount; a first current mirror circuit having an input node to which the first current source is connected, the first current mirror circuit being configured to fold and supply the first current to the gate of the power transistor; and an on-fixing switch connected between the gate of the power transistor and a high-level line in which a high voltage equivalent to a high level of a gate voltage of the power transistor is generated. The control circuit is configured to control the on-fixing switch and the first current source. In response to an instruction to turn on the power transistor, the control circuit is configured to (i) set the first current to the first current amount and turn off the on-fixing switch in a first period, (ii) set the first current to the second current amount and turn off the on-fixing switch in a second period, and (iii) turn on the on-fixing switch in a third period.

According to this aspect, a period up to immediately before the power transistor is turned on is defined as the first period, during which the drive current in the first current amount is supplied to the gate of the power transistor to increase the gate voltage. Then, after the power transistor is turned on, during the second period in which the reverse recovery current can flow through the flywheel diode of an arm on the opposite side, the power transistor is gradually turned on while keeping on-resistance of the power transistor large by reducing the drive current supplied to the gate of the power transistor. In this way, it is possible to suppress the through current and the ringing caused by the reverse recovery current of the flywheel diode of the arm on the opposite side. Next, in the third period in which the reverse recovery current is less likely to flow, turn-on time of the power transistor can be shortened, and the power consumption can be reduced by increasing the current amount supplied to the gate more than that in the second period. Moreover, in both the first period and the second period, the first current mirror circuit takes actions, and a quantity of an input current of the first current mirror circuit is switched. Therefore, when the quantity of the input current is switched in the second period, an electric current supplied to the gate changes gradually. In this way, the power consumption can be further reduced.

In one embodiment, an electric current supplied to the gate of the power transistor in the third period may be larger than electric currents supplied to the gate of the power transistor in the first period and the second period. After influence of reverse recovery characteristics of the flywheel diode of the arm on the opposite side is reduced, the on-resistance of the power transistor can be reduced in a short time, and efficiency of the bridge circuit can be improved by increasing the current amount supplied to the gate of the power transistor.

In one embodiment, the on-fixing switch may include a plurality of transistors disposed on a plurality of parallel paths, and the number of the transistors in action may be variable. Impedance of the on-fixing switch can be adjusted according to the number of transistors that are turned on.

In one embodiment, the control circuit may turn on some of the plurality of the transistors in the first period. In this way, a rising speed of the gate voltage of the power transistor in the first period can be increased, and the turn-on time can be shortened.

In one embodiment, the control circuit may turn on all of the plurality of the transistors in a fourth period following the third period. In this way, the power transistor can be fixed to an ON state. Further, a switch for fixing the power transistor to be on can also be used as the turn-on circuit.

In one embodiment, the control circuit may further include a first enable switch connected between an output node of the first current mirror circuit and the gate of the power transistor. The first current mirror circuit can be switched to be enabled or disabled according to a state of the first enable switch, and the power consumption can be reduced by turning the first current mirror circuit into a disabled state.

In one embodiment, the control circuit may turn on the first enable switch during the first period and the second period and turn off the first enable switch during a fourth period following the third period.

In one embodiment, the control circuit may turn on the first enable switch in the third period. Since the first current mirror circuit continues to take actions during transition from the second period to the third period, it is possible to suppress discontinuity of the current generated by the current mirror circuit.

In one embodiment, the control circuit may turn off the first enable switch in the third period.

In one embodiment, the control circuit may turn on the on-fixing switch in the fourth period following the third period.

In one embodiment, the first current mirror circuit may further have a second output node. The turn-off circuit may include: a second current mirror circuit having an input node to which the second output node of the first current mirror circuit is connected and an output node; a second enable switch connected between the output node of the second current mirror circuit and the gate of the power transistor; and an off-fixing switch connected between the gate of the power transistor and a low-level line in which a low voltage equivalent to a low level of the gate voltage of the power transistor is generated.

In one embodiment, the first current source may include: an output node; a first constant current circuit connected to the output node; a first switch and a second constant current circuit connected in series between the output node and a ground; and a second switch and a third constant current circuit connected in series between an output of the second constant current circuit and the ground. Since an electric current generated by the first constant current circuit is always supplied to the first current mirror circuit, an operating point of the first current mirror circuit when the first enable switch is off can be maintained near an operating point in action when the first enable switch is on. In this way, when the first enable switch is switched from off to on, the first current mirror circuit can promptly start operating.

In one embodiment, the gate driver circuit may further include a first sensor that compares a gate-source voltage of the power transistor with a first threshold voltage. The control circuit may shift to the second period in response to a change in output of the first sensor in the first period. By monitoring the gate-source voltage of the power transistor, a magnitude of the drive current can be changed in conjunction with the transition of the power transistor from an OFF state to the ON state. The first threshold voltage may be equal to, higher than, or lower than a gate threshold value of an MOSFET.

In one embodiment, the first sensor may be shared with a high-side off sensor that detects that the high-side transistor has been turned off. In this way, the drive current can be reduced before the high-side transistor is turned into an ON state. Further, an increase in an area of the circuit can be suppressed.

In one embodiment, the gate driver circuit may further include a second sensor that compares an output voltage of the switching circuit with a second threshold voltage. The control circuit may shift to the third period in response to a change in output of the second sensor in the second period. By monitoring the output voltage, it is possible to detect that the influence of the reverse recovery characteristics of the flywheel diode of the arm on the opposite side is reduced.

In one embodiment, the gate driver circuit may further include a third sensor that compares the output voltage of the switching circuit with a third threshold voltage. The control circuit may shift to the fourth period in response to a change in output of the third sensor in the third period.

In one embodiment, the gate driver circuit may be integrally integrated on one semiconductor substrate. The term "integrally integrated" includes a case where all components of the circuit are formed on the semiconductor substrate and a case where main components of the circuit are integrally integrated, and some resistors, capacitors, and the like may be disposed outside the semiconductor substrate for adjusting a circuit constant. By integrating the circuits on one chip, the area of each of the circuits can be reduced, and characteristics of circuit elements can be kept uniform.

A motor-driving apparatus according to one embodiment includes: a bridge circuit including the high-side transistor and the low-side transistor; a high-side driver that is one of the above-described gate driver circuits for driving the high-side transistor as the power transistor; and a low-side driver that is one of the above-described gate driver circuits for driving the low-side transistor as the power transistor.

An electronic device according to one embodiment includes a motor and the above-described motor-driving apparatus that drives the motor.

EMBODIMENTS

Hereinafter, preferred embodiments will be described with reference to the drawings. The same or equivalent components, members, and processes illustrated in each of the drawings are denoted by the same reference numerals, and redundant description will be omitted as appropriate. Further, the embodiments are not intended to limit the invention but are examples, and all features described in the embodiments and combinations thereof are not necessarily essential to the invention.

In the present description, "a state in which a member A is connected to a member B" includes not only a case where the member A and the member B are physically and directly connected to each other, but also a case where the member A and the member B are indirectly connected to each other via another member that does not substantially affect an electrical connection state between the member A and the member B or that does not impair functions or effects exhibited by coupling the member A with the member B.

Similarly, "a state in which the member C is disposed between the member A and the member B" includes not only a case where the member A and the member C, or the member B and the member C are directly connected to each other, but also a case where the members are indirectly connected to each other via another member that does not substantially affect an electrical connection state between the member A and the member C or the member B and the member C or that does not impair functions or effects exhibited by coupling the member A with the member C or coupling the member B with member C.

Figure 2:
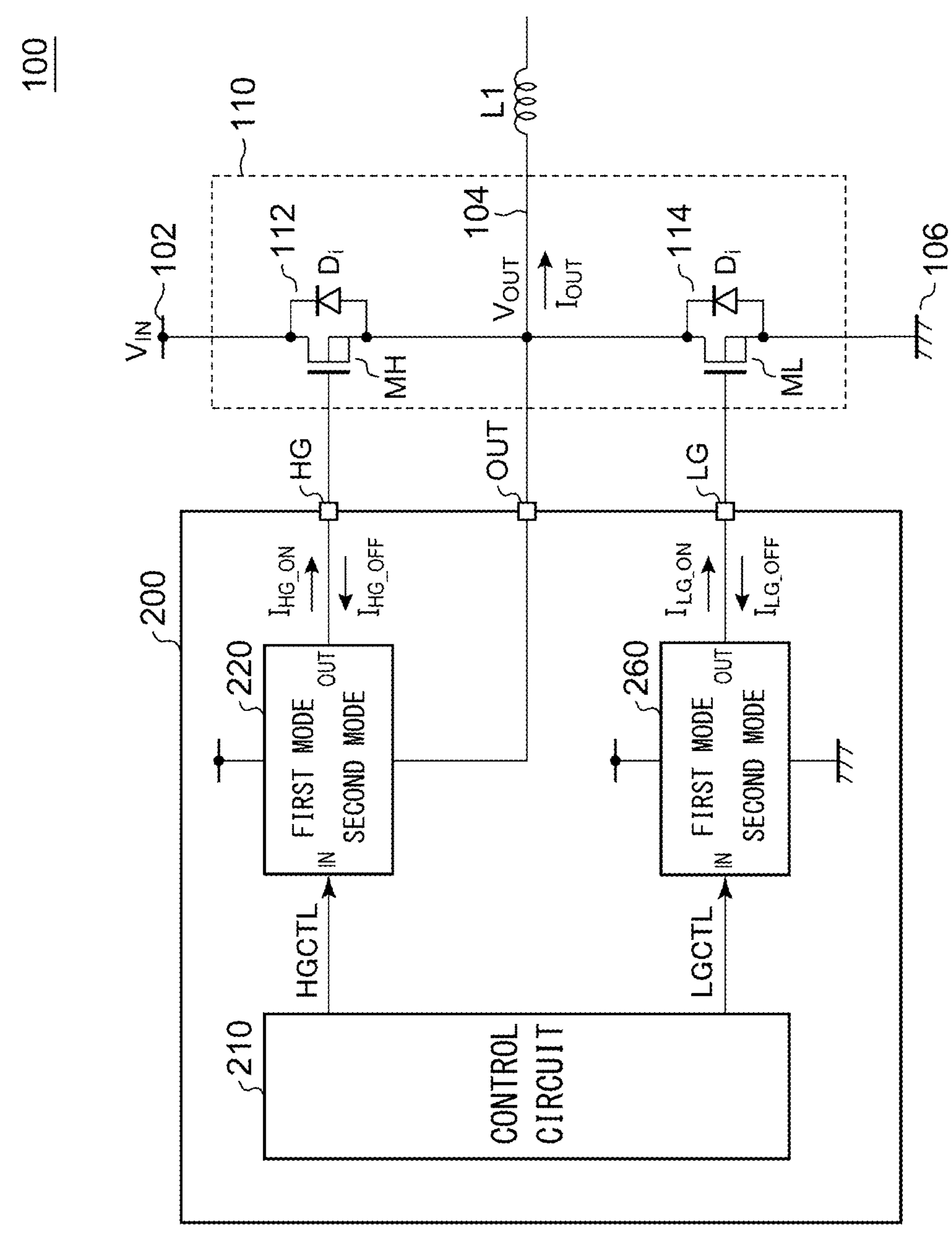
FIG. 2 is a circuit diagram of a switching circuit according to an embodiment.

FIG. 2 is a circuit diagram of a switching circuit 100 according to an embodiment. The switching circuit 100 includes a bridge circuit 110 and a drive circuit 200. Here, only one phase configuration of the switching circuit 100 is illustrated, but the switching circuit 100 may be a three-phase type or may be an H-bridge circuit.

The bridge circuit 110 includes an upper arm 112 disposed between a power supply line (input line) 102 and an output terminal (output line) 104, and a lower arm 114 disposed between the output line 104 and a ground line 106. The upper arm 112 includes the high-side transistor MH and the flywheel diode (freewheel diode) Di, which are connected in parallel. The lower arm 114 includes the low-side transistor ML and the flywheel diode Di, which are connected in parallel. In the present embodiment, the high-side transistor MH and the low-side transistor ML are N-channel MOSFETs, and a body diode of each of the transistors also serves as the flywheel diode Di.

The drive circuit 200 controls the upper arm 112 and the lower arm 114 of the bridge circuit 110. The drive circuit 200 switches among three states including a high impedance state φ1 in which both the upper arm 112 and the lower arm 114 are off, a high output state φ2 in which the upper arm 112 is on and the lower arm 114 is off, and a low output state φ3 in which the upper arm 112 is off and the lower arm 114 is on. For the output current $I_{OUT}$, a direction where the current flows from the output line 104 of the bridge circuit 110 toward the inductor L1, which is a load, is positive, and the opposite direction is negative. For each of the three states φ1 to φ3, there are states φ1A to φ3A in which the output current $L_{OUT}$ is positive (current source) and states φ1B to φ3B in which the output current $I_{OUT}$ is negative (current sink).

The drive circuit 200 includes a control circuit 210, a high-side driver circuit 220, and a low-side driver circuit 260, and is a functional IC integrated on one semiconductor substrate. The control circuit 210 selects the states φ1 to φ3 according to a state of the load of the bridge circuit 110 and generates control signals HGCTL and LGCTL according to each of the states φ1 to φ3. In the state φ1, both the high-side control signal HGCTL and the low-side control signal LGCTL are at an OFF level (for example, low). In the state φ2, the high-side control signal HGCTL is at an ON level (for example, high), and the low-side control signal LGCTL is at the OFF level. In the state φ3, the high-side control signal HGCTL is at the OFF level, and the low-side control signal LGCTL is at the ON level.

The high-side driver circuit 220 receives the high-side control signal HGCTL at an input node IN, and an output node OUT is connected to a gate of the high-side transistor MH via a high-side gate pin HG. If the high-side control signal HGCTL transitions from the OFF level to the ON level, the high-side driver circuit 220 supplies a drive current $I_{HG\_ON}$ to the gate of the high-side transistor MH, increases a gate-source voltage $V_{GS}$ of the high-side transistor MH, and turns on the high-side transistor MH. If the high-side control signal HGCTL transitions from the ON level to the OFF level, the high-side driver circuit 220 extracts a drive current $I_{HG\_OFF}$ from the gate of the high-side transistor MH, reduces the gate-source voltage $V_{GS}$, and turns off the high-side transistor MH.

The high-side driver circuit 220 can select a plurality of operation modes when the high-side transistor MH is turned on, and one of the operation modes is referred to as a first mode. In the first mode, the high-side driver circuit 220 changes the drive current $I_{HG\_ON}$ supplied to the gate of the high-side transistor MH in multiple stages according to a state of the bridge circuit 110.

In the first mode, the high-side driver circuit 220 outputs the drive current $I_{HG\_ON}$ in a first current amount $I_1$ during a first period T1 after the high-side control signal HGCTL transitions from the OFF level to the ON level, and outputs the drive current $I_{HG\_ON}$ in a second current amount $I_2$ less than the first current amount $I_1$ during a second period T2 following the first period T1. Then, in the third period T3 following the second period T2, the high-side driver circuit 220 outputs the drive current $I_{HG\_ON}$ in a third current amount $I_3$ larger than the first current amount $I_1$ and the second current amount $I_2$.

The high-side driver circuit 220 is configured to be operable in a second mode in addition to the first mode. In the second mode, a waveform of the drive current $I_{HG\_ON}$ generated by the high-side driver circuit 220 is different from that in the first mode. Specifically, in the second mode, the drive current $I_{HG\_ON}$ is in a constant quantity Ic larger than the second current amount $I_2$ from transition of the high-side control signal HGCTL from the OFF level to the ON level to completion of state transition of the bridge circuit 110. The constant quantity Ic may be larger than any of the first current amount $I_1$ to the third current amount $I_3$.

The low-side driver circuit 260 receives the low-side control signal LGCTL at the input node IN, and the output node OUT is connected to a gate of the low-side transistor ML via a low-side gate pin LG. If the low-side control signal LGCTL transitions from the OFF level (for example, low) to the ON level (high), the low-side driver circuit 260 supplies a drive current $I_{LG\_ON}$ to the gate of the low-side transistor ML, increases a gate-source voltage $V_{GS}$ of the low-side transistor ML, and turns on the low-side transistor ML. Further, if the low-side control signal LGCTL transitions from the ON level to the OFF level, the low-side driver circuit 260 extracts a drive current $I_{LG\_OFF}$ from the gate of the low-side transistor ML, reduces the gate-source voltage $V_{GS}$, and turns off the low-side transistor ML.

Similarly to high-side driver circuit 220, the low-side driver circuit 260 is configured to be switchable between the first mode and the second mode.

In the first mode, the low-side driver circuit 260 changes the drive current $I_{LG\_ON}$ supplied to the gate of the low-side transistor ML in multiple stages according to the state of the bridge circuit 110.

In the first mode, the low-side driver circuit 260 outputs the drive current $I_{LG\_ON}$ in a fourth current amount $I_4$ during a fourth period T4 after the low-side control signal LGCTL transitions from the OFF level to the ON level, and outputs the drive current $I_{LG\_ON}$ in a fifth current amount $I_5$ less than a fourth current amount $I_4$ during a fifth period T5 following the fourth period T4. Then, in a sixth period T6 following the fifth period T5, the low-side driver circuit 260 outputs the drive current $I_{LG\_ON}$ in the fourth current amount $I_4$ and a sixth current amount $I_6$ larger than the fifth current amount $I_5$.

In the second mode, a waveform of the drive current $I_{LG\_ON}$ generated by the low-side driver circuit 260 is different from that in the first mode. Specifically, in the second mode, the drive current $I_{LG\_ON}$ is in a constant quantity Id larger than the fifth current amount $I_5$ from the transition of the low-side control signal LGCTL from the OFF level to the ON level to the completion of the state transition of the bridge circuit 110. The constant quantity Id may be larger than any of the fourth current amount $I_4$ to the sixth current amount $I_6$.

The above is the configuration of the switching circuit 100. Next, the operation thereof will be described.

First, the operation of the high-side driver circuit 220 will be described. The high-side driver circuit 220 operates in the first mode in a situation where a reverse recovery current of the flywheel diode of the lower arm 114 can be generated and operates in the second mode in a situation where the reverse recovery current of the flywheel diode of the lower arm 114 is not generated.

Specifically, the high-side driver circuit 220 operates in the first mode in a situation (source rise) where the high-side transistor MH is turned on from the state φ1A in which the high-side transistor MH and the low-side transistor ML are turned off and the current $I_{OUT}$ is sourced via the flywheel diode Di of the lower arm 114.

Further, the high-side driver circuit 220 operates in the second mode in a situation (sink rise) where the high-side transistor MH is turned on from a state in which the high-side transistor MH is turned off, the low-side transistor ML is turned on, and the current $I_{OUT}$ is sunk via the low-side transistor ML.

Figure 3:
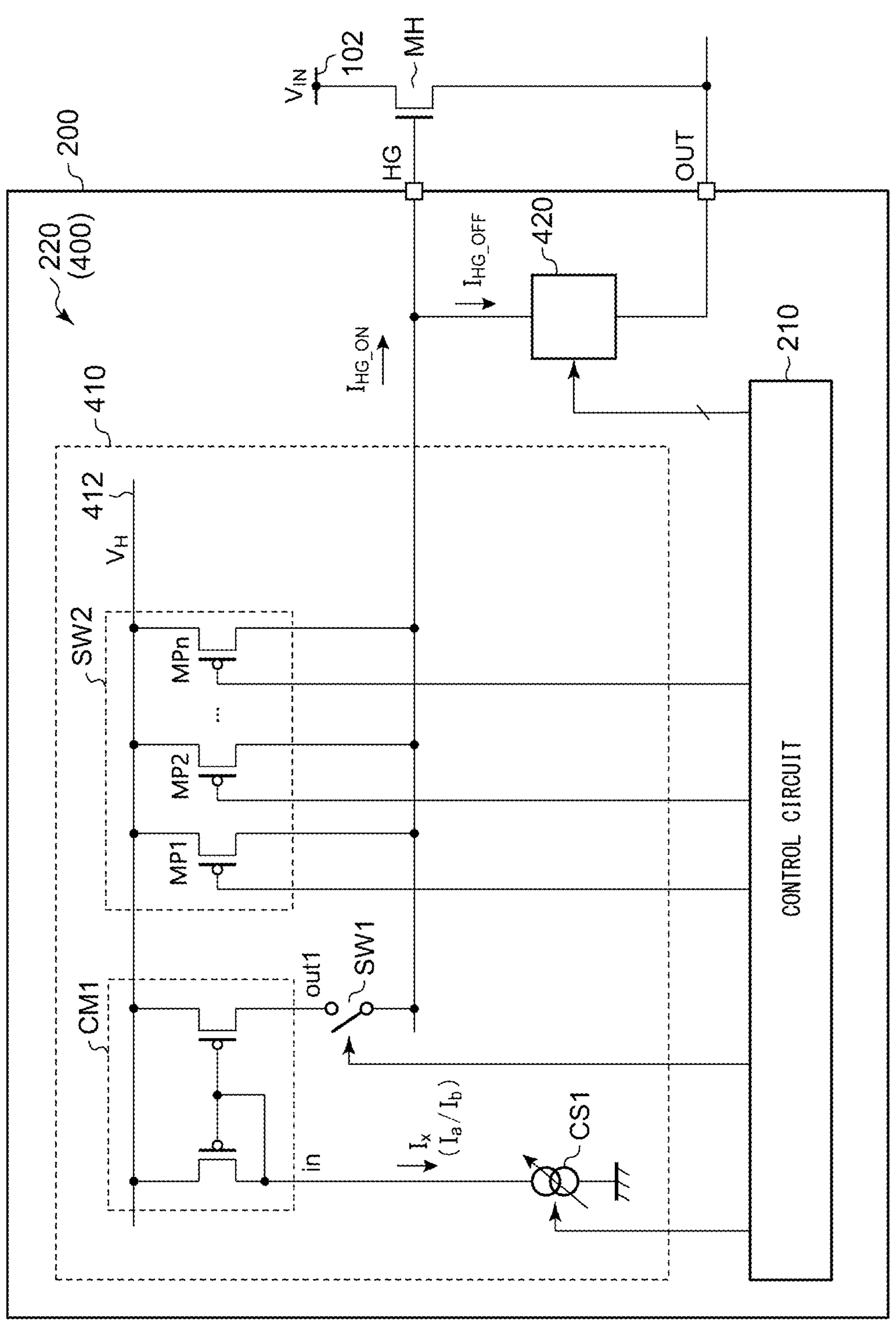
FIG. 3 is a circuit diagram of a gate driver circuit according to an embodiment.

FIG. 3 is a circuit diagram of a gate driver circuit 400 according to an embodiment. Here, the gate driver circuit 400 is the high-side driver circuit 220 in FIG. 2 and drives the high-side transistor MH forming the upper arm.

A turn-on circuit 410 is configured to source an on-current $I_{HG\_ON}$ to the gate of the high-side transistor MH which is the N-type power transistor. A turn-off circuit 420 is configured to sink the current $I_{HG\_OFF}$ from the gate of the high-side transistor MH.

The turn-on circuit 410 includes a first current source CS1, a first current mirror circuit CM1, a first enable switch SW1, and an on-fixing switch SW2.

The first current source CS1 outputs a first current Ix in an ON state. The first current source CS1 is configured such that a current amount of the first current Ix can be switched between a first current amount Ia and a second current amount Ib less than the first current amount Ia.

In a case where the first current source CS1 is in an OFF state, the first current Ix may be completely zero, but preferably, the first current source CS1 may be configured to output a minute current amount Ic.

The first current source CS1 is connected to the first current mirror circuit CM1 at an input node in. The first current mirror circuit CM1 folds back the first current Ix, and outputs the first current Ix from a first output node out1. The first enable switch SW1 is disposed between the first output node out1 of the first current mirror circuit CM1 and the gate (that is, the high-side gate pin HG) of the high-side transistor MH.

The on-fixing switch SW2 is connected between the gate of the high-side transistor MH and a high-level line 412 in which a high voltage $V_H$ equivalent to a high level of a gate voltage of the high-side transistor MH is generated. The high voltage $V_H$ may be a bootstrap voltage generated by a bootstrap circuit or may be generated by a charge pump circuit. The on-fixing switch SW2 includes a plurality of transistors MP1 to MPn disposed on a plurality of n ($n \geq 2$) parallel paths between the high-level line 412 and the gate of the high-side transistor MH. The plurality of transistors MP1 to MPn can be individually controlled to be on and off, and thus impedance of the on-fixing switch SW2 can be controlled. A state in which all of the plurality of transistors MP1 to MPn are off corresponds to an OFF state of the on-fixing switch SW2. A state in which at least one of the plurality of transistors MP1 to MPn is on corresponds to an ON state of the on-fixing switch SW2. A state in which all of the plurality of transistors MP1 to MPn are on is referred to as a full-ON state of the on-fixing switch SW2.

Sizes of the plurality of transistors MP1 to MPn may all be equal or may be binary-weighted. The sizes of the transistors are in a dimension of gate width/gate length (W/L).

The control circuit 210 generates the control signal HGCTL indicating states of the turn-on circuit 410 and the turn-off circuit 420. Specifically, the control circuit 210 is configured to control the first current source CS1, the first enable switch SW1, and the on-fixing switch SW2 with respect to the turn-on circuit 410.

In the first mode, the control circuit 210 operates in the following sequence in response to an instruction to turn on the high-side transistor MH.

(i) First Period T1

The first current source CS1 is turned on. The first current Ix of the first current source CS1 is in the first current amount Ia. Further, the first enable switch SW1 is on, and the on-fixing switch SW2 is off.

In the first period T1, the current $I_{HG\_ON}$ in the first current amount $I_1$ is supplied to the gate of the high-side transistor MH. When a mirror ratio of the first current mirror circuit CM1 is α, the first current amount $I_1$ is expressed by the following equation.

$$I_1 = Ia * \alpha$$

(ii) Second Period T2

The first current Ix is reduced to the second current amount Ib while the first current source CS1 is kept on. The first enable switch SW1 is kept on, and the on-fixing switch SW2 is kept off.

In the second period T2, the current $I_{HG\_ON}$ in the second current amount $I_2$ is supplied to the gate of the high-side transistor MH. The second current amount $I_2$ is expressed by the following equation.

$$I_2 = Ib * \alpha$$

Since $$Ib < Ia,$$

$$I_2 < I_1.$$

(iii) Third Period T3

The first current source CS1 is on, the first current Ix is maintained in the second current amount Ib, and the first enable switch SW1 is on. The on-fixing switch SW2 is switched to on. In the third period T3, at least one of the transistors MP1 to MPn constituting the on-fixing switch SW2 is turned on.

In the third period T3, the current $I_{HG\_ON}$ in the third current amount $I_3$ is supplied to the gate of the high-side transistor MH. The transistor turned on in the third period T3 is selected to satisfy $I_3 > I_1$.

More preferably, the transistor turned on in the third period T3 may be selected such that the transistor turned on operates in a saturation region.

(iv) Fourth Period T4

The first current source CS1 and the first enable switch SW1 are turned off, and the on-fixing switch SW2 is turned on. In the on-fixing switch SW2, all the transistors MP1 to MPn are turned on.

Figure 4:
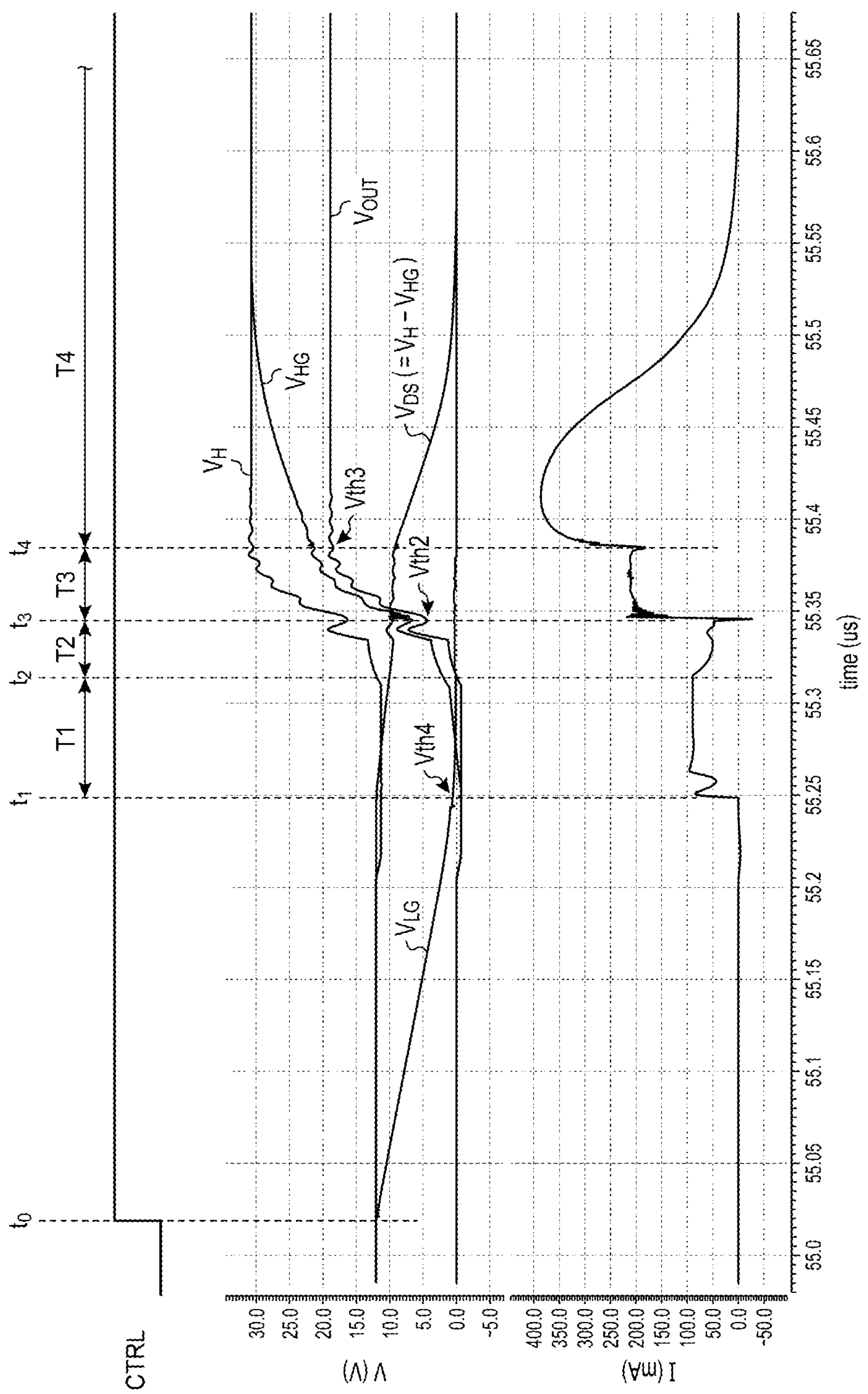
FIG. 4 is an operation waveform diagram of the gate driver circuit in FIG. 3.

FIG. 4 is an operation waveform diagram of the gate driver circuit 400 in FIG. 3. A control signal CTRL is a logic signal indicating the state of the bridge circuit 110. A current $I_{MH}$ indicates a current flowing through the high-side transistor MH, and a current $I_{ML}$ indicates a current flowing through the low-side transistor ML. The direction where the current flows from a drain to the source is positive. $V_{LG}$ is a gate voltage (gate-source voltage) of the low-side transistor ML. $V_{HG}$ represents a gate voltage of the high-side transistor MH, and $V_{OUT}$ represents the output voltage. A potential difference between $V_{HG}$ and $V_{OUT}$ is a gate-source voltage of the high-side transistor MH.

Before time $t_0$, the control signal CTRL is at a low level, the high-side transistor MH is off, the low-side transistor ML is on, and the output voltage $V_{OUT}$ is at a low voltage (0 V).

FIG. 4 illustrates an operation in a current source mode, and the negative current $I_{ML}$ flows through the low-side transistor ML before the time to.

At the time $t_0$, the control signal CTRL transitions to the high level. In this way, the low-side driver circuit 260 reduces the gate voltage $V_{LG}$ of the low-side transistor ML, and turns off the low-side transistor ML.

If the gate voltage $V_{LG}$ of the low-side transistor ML becomes lower than a fourth threshold voltage Vth4 at time $t_1$, the high-side driver circuit 220 becomes active. In the first period T1, the turn-on circuit 410 supplies the current $I_{HG\_ON}$ in the first current amount $I_1$ to the gate of the high-side transistor MH.

Then, if a gate-source voltage $V_{HG}$-$V_{OUT}$ of the high-side transistor MH exceeds a first threshold voltage Vth1 at time $t_2$, shift to the second period T2 occurs. In the second period T2, the turn-on circuit 410 supplies the current $I_{HG\_ON}$ in the second current amount $I_2$ to the gate of the high-side transistor MH. The second current amount $I_2$ is less than the first current amount $I_1$.

Then, if the output voltage $V_{OUT}$ exceeds a second threshold voltage Vth2 at time $t_3$, shift to the third period T3 occurs. In the third period T3, the on-fixing switch SW2 is turned on, and the turn-on circuit 410 supplies the current $I_{HG\_ON}$ in the third current amount $I_3$ to the gate of the high-side transistor MH. The third current amount $I_3$ is larger than the first current amount $I_1$ and the second current amount $I_2$. In the third period T3, drain-source voltages $V_{DS}(=V_H-V_{HG})$ of the transistors MP1 to MPn constituting the second enable switch SW3 are about 9 V to 10 V and operate in the saturation region. In the saturation region, since a drain current does not depend on the drain-source voltage, there is an advantage that the third current amount $I_3$ in the third period T3 is easily controlled.

Then, if the output voltage $V_{OUT}$ exceeds a third threshold voltage Vth3 defined near an input voltage $V_{IN}$ at time $t_4$, shift to the fourth period T4 occurs, and the on-fixing switch SW2 is in the full-ON state. If the on-fixing switch SW2 is in the full-ON state, the gate voltage $V_{HG}$ of the high-side transistor MH is fixed to a high-level voltage, and the high-side transistor MH is strongly fixed in the ON state.

The above is the operation of the switching circuit 100.

With the switching circuit 100, a period immediately before the high-side transistor MH is turned on is set as the first period T1, and the drive current $I_{HG\_ON}$ in the first current amount $I_1$ is supplied to the gate of the high-side transistor MH to increase the gate voltage $V_{HG}$. Then, after the high-side transistor MH is turned on, during the second period T2 in which the reverse recovery current can flow through the flywheel diode of the lower arm, the drive current $I_{HG\_ON}$ supplied to the gate of the high-side transistor MH is reduced to the second current amount $I_2$, whereby the high-side transistor MH is gradually turned on while on-resistance of the high-side transistor MH is kept large. In this way, it is possible to suppress the through current and the ringing caused by the reverse recovery current of the flywheel diode of the arm on the opposite side of the upper arm, that is, the lower arm which is a target to be driven by the drive circuit 200.

Next, in the third period T3 in which the reverse recovery current is less likely to flow, turn-on time of the high-side transistor MH can be shortened and the power consumption can be reduced by increasing the drive current $I_{HG\_ON}$ supplied to the gate of the high-side transistor MH to the third current amount $I_3$ larger than that in the second period T2.

Moreover, in both the first period T1 and the second period T2, the first current mirror circuit CM1 operates to change a quantity of the input current Ix of the first current mirror circuit CM1. Therefore, when the first period T1 is switched to the second period T2, the drive current $I_{HG\_ON}$ gradually changes from the first current amount $I_1$ to the second current amount $I_2$. In this way, the power consumption can be further reduced.

Moreover, the drive current $I_{HG\_ON}$ supplied to the gate of the high-side transistor MH in the third period T3 is larger than the first current amount $I_1$ in the first period T1. In this way, since the on-resistance of the high-side transistor MH can be reduced in a short time, the efficiency of the bridge circuit can be further improved.

Next, a configuration example of the turn-off circuit 420 will be described.

Figure 5:
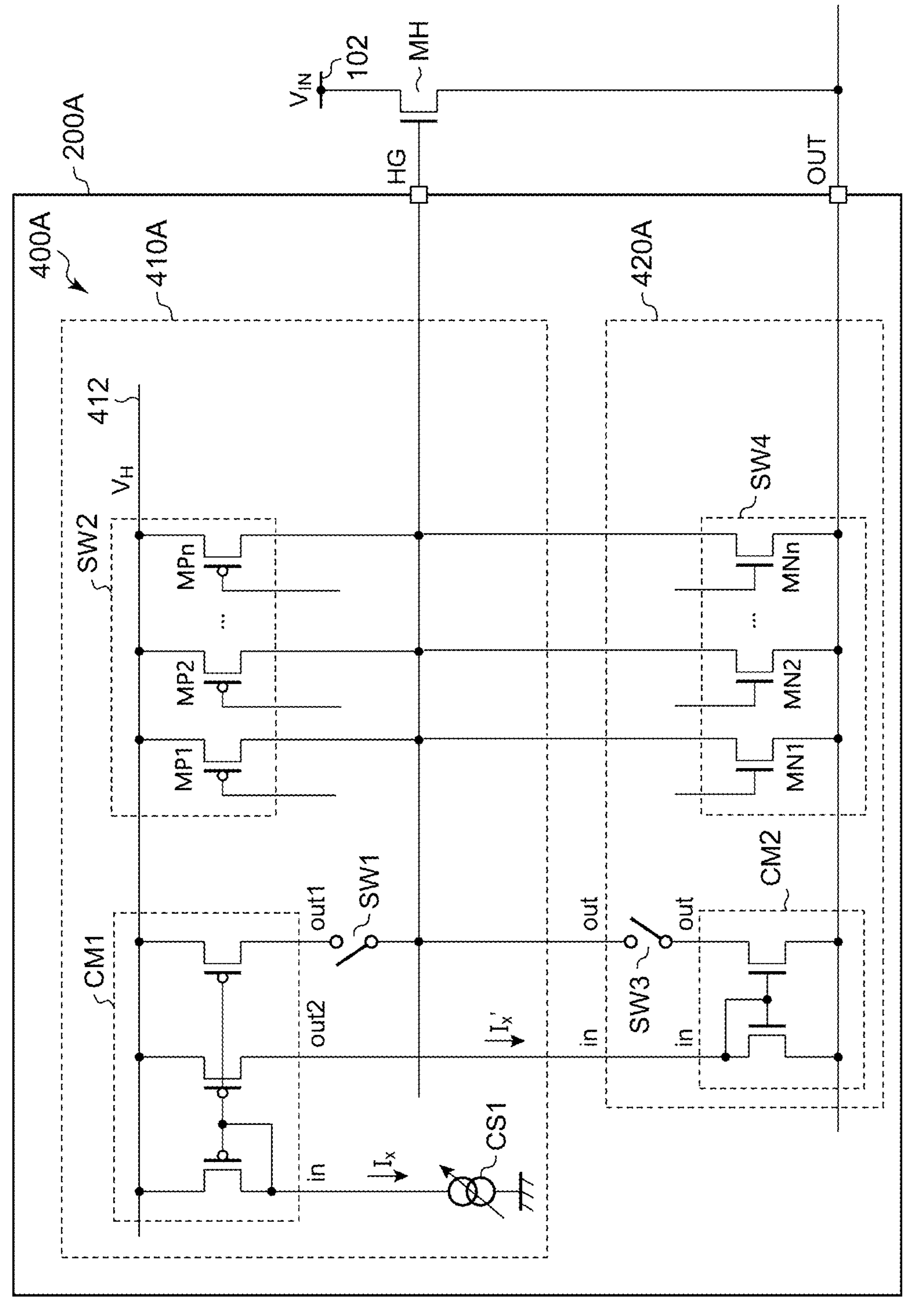
FIG. 5 is a circuit diagram of a drive circuit including the gate driver circuit.

FIG. 5 is a circuit diagram of a drive circuit 200A including a gate driver circuit 400A. The gate driver circuit 400A includes a turn-on circuit 410A and a turn-off circuit 420A.

A basic configuration of the turn-on circuit 410A is similar to that in FIG. 3, and includes the first current source CS1, the first current mirror circuit CM1, the first enable switch SW1, and the on-fixing switch SW2.

The first current mirror circuit CM1 has a second output node out2. The first current mirror circuit CM1 folds back the current Ix and supplies a current Ix' to the turn-off circuit 420A.

The turn-off circuit 420A includes a second current mirror circuit CM2, a second enable switch SW3, and an off-fixing switch SW4.

An input node in of the second current mirror circuit CM2 is connected to the second output node out2 of the first current mirror circuit CM1. The second current mirror circuit CM2 folds back the current Ix'. The second enable switch SW3 is disposed between the output node out of the second current mirror circuit CM2 and the gate of the high-side transistor MH.

The off-fixing switch SW4 is connected between a gate and a source of the high-side transistor MH. The off-fixing switch SW4 is configured similarly to the on-fixing switch SW2. Specifically, the off-fixing switch SW4 includes a plurality of transistors MN1 to MNn disposed on a plurality of n (n≥2) parallel paths between the gate and the source of the high-side transistor MH. The plurality of transistors MN1 to MNn can be individually controlled to be on and off, and thus impedance of the off-fixing switch SW4 can be controlled. A state in which all of the plurality of transistors MN1 to MNn are off corresponds to an OFF state of the off-fixing switch SW4. A state in which at least one of the plurality of transistors MN1 to MNn is on corresponds to an ON state of the off-fixing switch SW4. A state in which all of the plurality of transistors MN1 to MNn are on is referred to as a full-ON state of the off-fixing switch SW4. Sizes of the plurality of transistors MN1 to MNn may all be equal or may be binary-weighted.

The second enable switch SW3 and the off-fixing switch SW4 of the turn-off circuit 420 are controlled according to the control signal HGCTL generated by the control circuit 210.

With the turn-off circuit 420A, when the high-side transistor MH is turned off, the drive current $I_{HG\_OFF}$ generated by the turn-off circuit 420A can be changed stepwise, similarly to the drive current $I_{HG\_ON}$ when the high-side transistor MH is turned on.

Next, a configuration example of the turn-on circuit 410 will be described in more detail.

Figure 6:
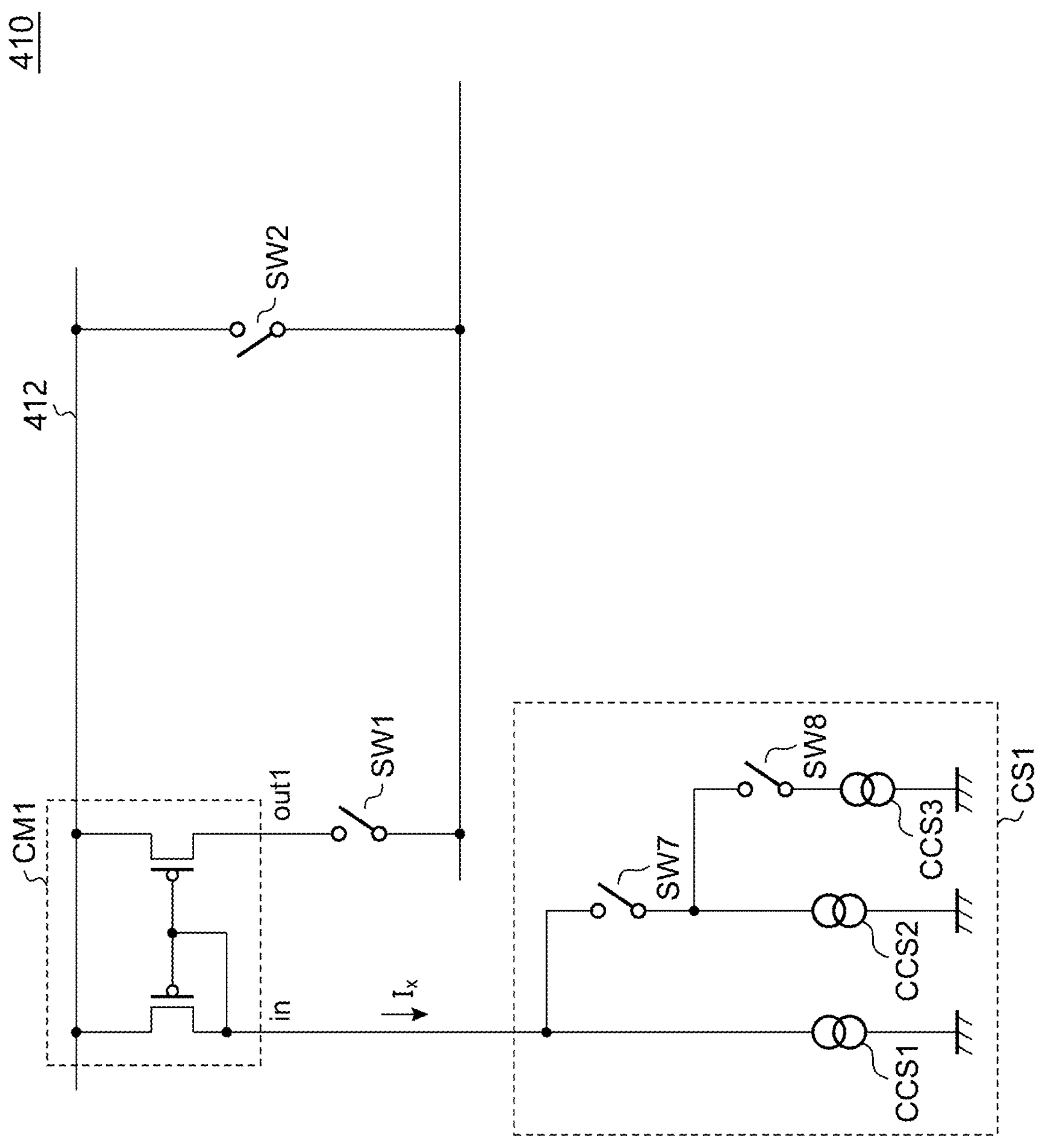
FIG. 6 is a circuit diagram illustrating a configuration example of a turn-on circuit.

FIG. 6 is a circuit diagram illustrating a configuration example of the turn-on circuit 410. The first current source CS1 includes a first constant current circuit CCS1, a second constant current circuit CCS2, a third constant current circuit CCS3, a first switch SW7, and a second switch SW8.

The first constant current circuit CCS1 is connected to an output node of the first current source CS1. The first switch SW7 and the second constant current circuit CCS2 are connected in series between the output node and the ground. The second switch SW8 and the third constant current circuit CCS3 are connected in series between an output of the second constant current circuit CCS2 and the ground.

In the OFF state of the first current source CS1, the first switch SW7 is off. In the ON state of the first current source CS1, the first switch SW7 and the second switch SW8 are on during the first period T1. During the second period T2, the first switch SW7 is turned on, and the second switch SW8 is turned off.

In the OFF state, the first current source CS1 continues to output an output current of the first constant current circuit CCS1 as the current Ix in a minute current amount. In this way, fluctuation of an operating point of the first current mirror circuit CM1 can be suppressed, and an operation speed of the first current mirror circuit CM1 can be increased. In this way, responsiveness of the turn-on circuit 410 can be enhanced.

Figure 7:
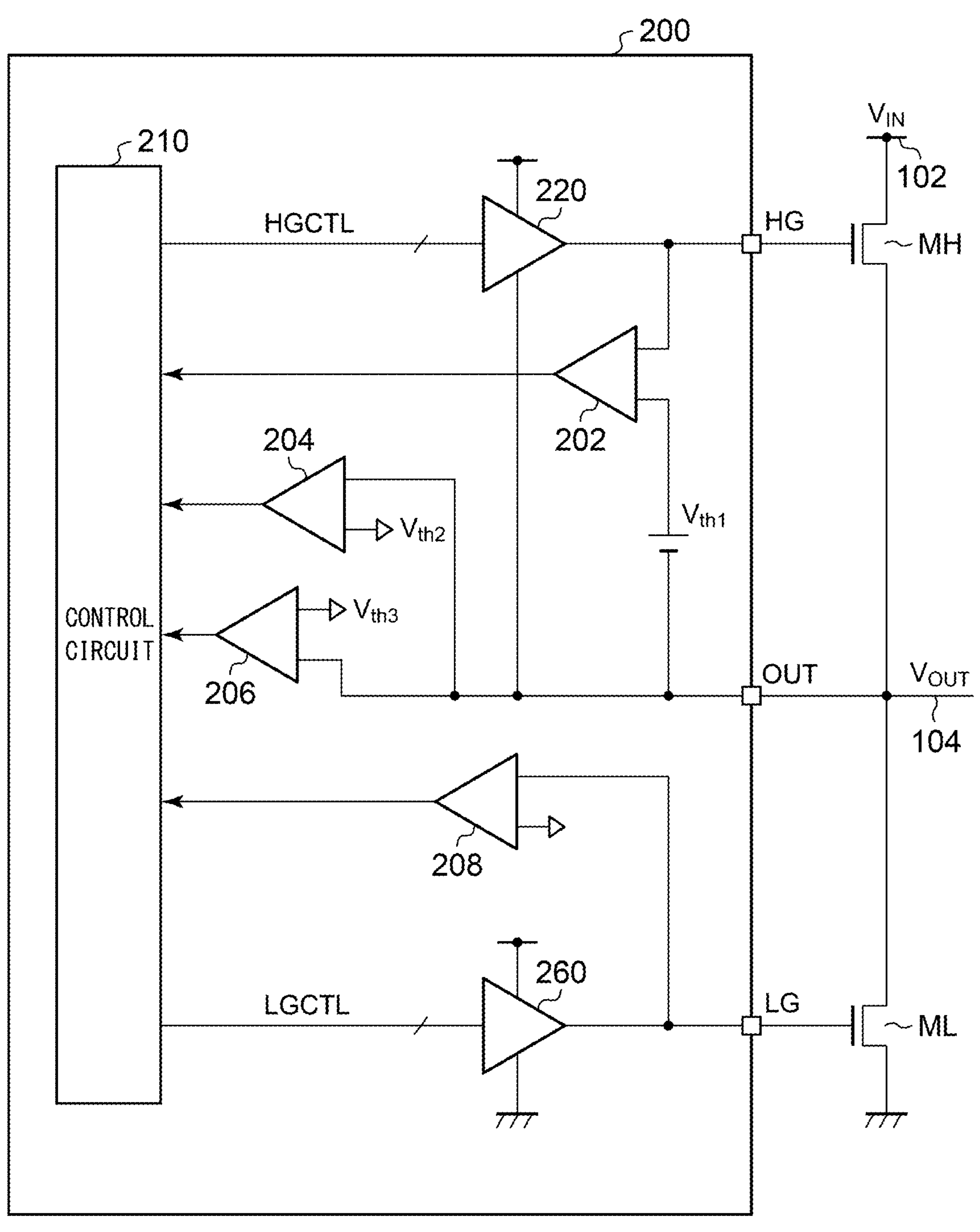
FIG. 7 is a circuit diagram of the drive circuit.

FIG. 7 is a circuit diagram of the drive circuit 200. The drive circuit 200 can include a first sensor 202, a second sensor 204, a third sensor 206, and a low-side off sensor 208.

The low-side off sensor 208 detects turn-off of the low-side transistor ML. The low-side off sensor 208 compares the gate-source voltage of the low-side transistor ML with the fourth threshold voltage Vth4. If detecting the turn-off of the low-side transistor ML based on an output of the low-side off sensor 208, the control circuit 210 shifts to the first period t1.

The first sensor 202 compares the gate-source voltage $V_{GS}$ of the high-side transistor MH with the first threshold voltage Vth1. The first threshold voltage Vth1 may be determined based on a threshold voltage $V_{GS(th)}$ of the MOSFET.

On the drive circuit 200, the high-side off sensor that detects that the high-side transistor MH has been turned off may often be disposed. The output of the high-side off sensor is referred to by the control circuit 210. The control circuit 210 monitors the output of the high-side off sensor and causes the low-side control signal LGCTL to transition to the ON level after the high-side transistor MH is reliably turned off. In this way, it is possible to prevent the high-side transistor MH and the low-side transistor ML from being turned on at the same time, and the through current is prevented.

In a case where the drive circuit 200 includes the high-side off sensor, the first sensor 202 can be shared with the high-side off sensor. In this way, the area of the circuit can be reduced.

If the output of first sensor 202 changes in the first period T1, that is, if the gate-source voltage $V_{GS}$ of the high-side transistor MH exceeds the first threshold voltage Vth1, the high-side driver circuit 220 shifts to the second period T2. In a case where the first threshold voltage Vth1 is set to be lower than the threshold voltage $V_{GS(th)}$ of the MOSFET, the high-side driver circuit 220 can be shifted to the second period T2 before the high-side transistor MH is turned on. In a case of a large response delay, the high-side driver circuit 220 shifts to the second period T2 at the same time as or slightly later than the turn-on of the high-side driver circuit 220.

By monitoring the gate-source voltage $V_{GS}$ of the high-side transistor MH, a magnitude of the drive current $I_{HG\_ON}$ can be changed in conjunction with the transition of the high-side transistor MH from the OFF state to the ON state.

The second sensor 204 compares an output voltage $V_{OUT}$ of the output line 104 with the second threshold voltage Vth2. The high-side driver circuit 220 shifts to the third period T3 in response to a change in output of the second sensor 204 in the second period T2. By monitoring the output voltage $V_{OUT}$, it is possible to detect that influence of reverse recovery characteristics of the flywheel diode Di of the lower arm 114 is reduced.

On the drive circuit 200, there may be disposed a sensor (voltage monitoring circuit) that compares the output voltage $V_{OUT}$ with a threshold voltage lower than the input voltage $V_{IN}$ by a predetermined voltage width for a purpose of detecting that transition of the output voltage $V_{OUT}$ from low to high is completed or for other purposes. In that case, by using the voltage monitoring circuit also as the second sensor 204, an increase in the area of the circuit can be suppressed.

The third sensor 206 compares the output voltage $V_{OUT}$ with the third threshold voltage Vth3 defined near the input voltage $V_{IN}$. If the $V_{OUT}$ exceeds the Vth3 with reference to an output of the third sensor 206, the control circuit 210 shifts to the fourth period T4.

Next, a configuration and operation of the low-side driver circuit 260 will be described. The low-side driver circuit 260 can be configured similarly to the high-side driver circuit 220.

The low-side driver circuit 260 operates in the first mode in a situation where a reverse recovery current of the flywheel diode of the upper arm 112 can be generated and operates in the second mode in a situation where the reverse recovery current of the flywheel diode of the upper arm 112 is not generated.

Specifically, the low-side driver circuit 260 operates in the first mode in a situation (sink fall) where the low-side transistor ML is turned on from the state φ1B in which the high-side transistor MH and the low-side transistor ML are turned off, and the current $I_{OUT}$ is sunk via the flywheel diode Di of the upper arm 112.

Further, the low-side driver circuit 260 operates in the second mode in a situation (source fall) where the low-side transistor ML is turned on from a state in which the high-side transistor MH is turned on, the low-side transistor ML is turned off, and the current $I_{OUT}$ is sourced via the high-side transistor MH.

Next, a modification of a sequence of the drive circuit 200 will be described.

First Sequence Modification

In the first sequence modification, the control circuit 210 turns on some of the transistors MP1 to MPn constituting the on-fixing switch SW2 in the first period T1. Others are similar as in the embodiments.

Figure 8:
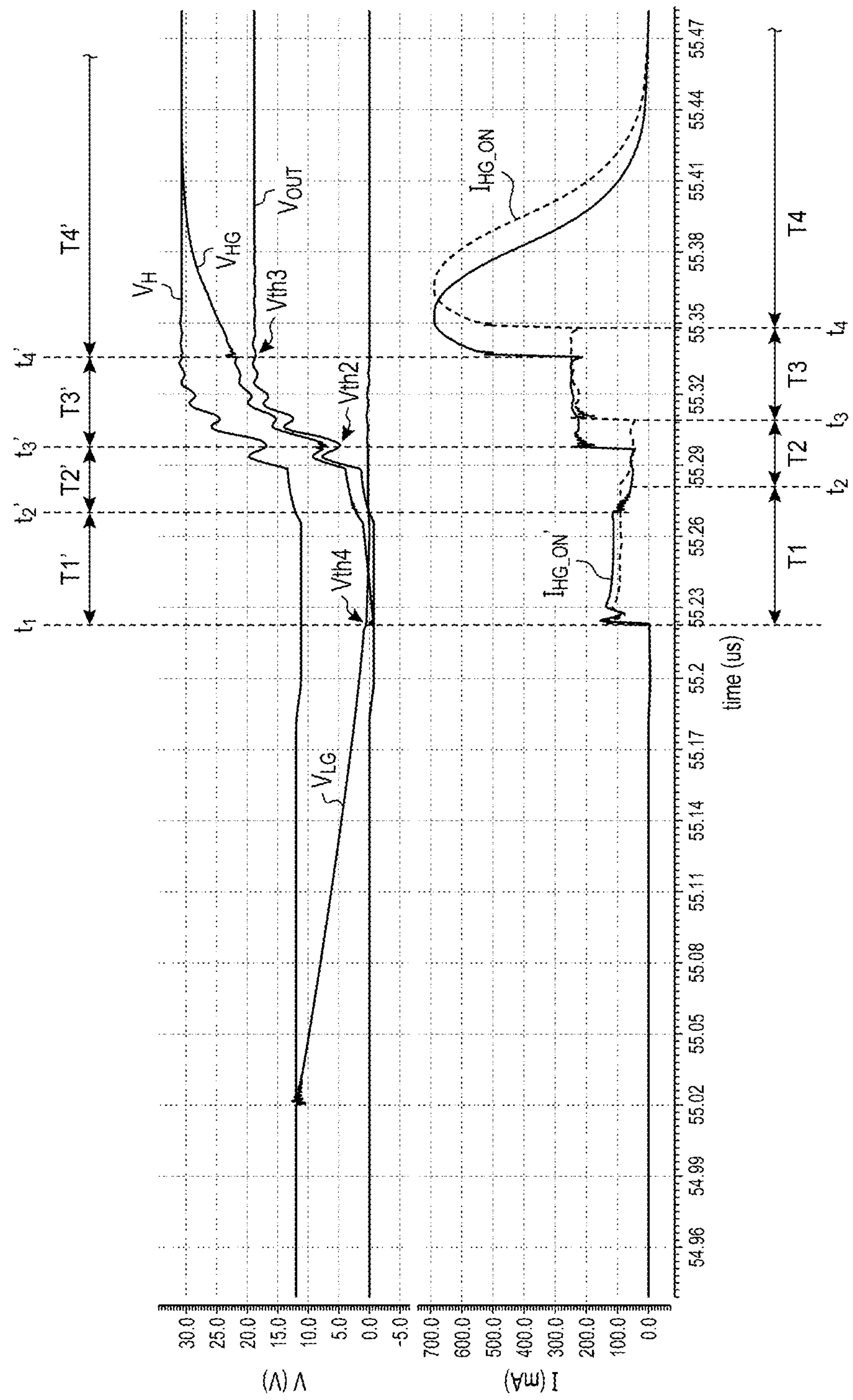
FIG. 8 is an operation waveform diagram of a drive circuit according to a first sequence modification.

FIG. 8 is an operation waveform diagram of the drive circuit 200 according to the first sequence modification. The upper part of FIG. 8 illustrates a voltage waveform in the first sequence modification. In the lower part of FIG. 8, a drive current $I_{HG\_ON}'$ in the first sequence modification is indicated by a solid line. For comparison, the drive current $I_{HG\_ON}$ in FIG. 4 is indicated by a broken line.

In the first sequence modification, since the on-fixing switch SW2 is turned on in the first period T1, the current amount $I_1$ of the drive current $I_{HG\_ON}'$ is larger than that in a case of FIG. 4. In this way, a rising speed of the gate voltage $V_{HG}$ in the first period T1 increases, and thus a timing $t_2'$ at which shift to a second period T2' occurs is also advanced. In other words, the turn-on time of the high-side transistor MH can be shortened as compared with the operation in FIG. 4.

Second Sequence Modification

In the second sequence modification, the control circuit 210 sets the on-fixing switch SW2 to the full-ON state in the third period T3. Others are similar as in the embodiments.

Figure 9:
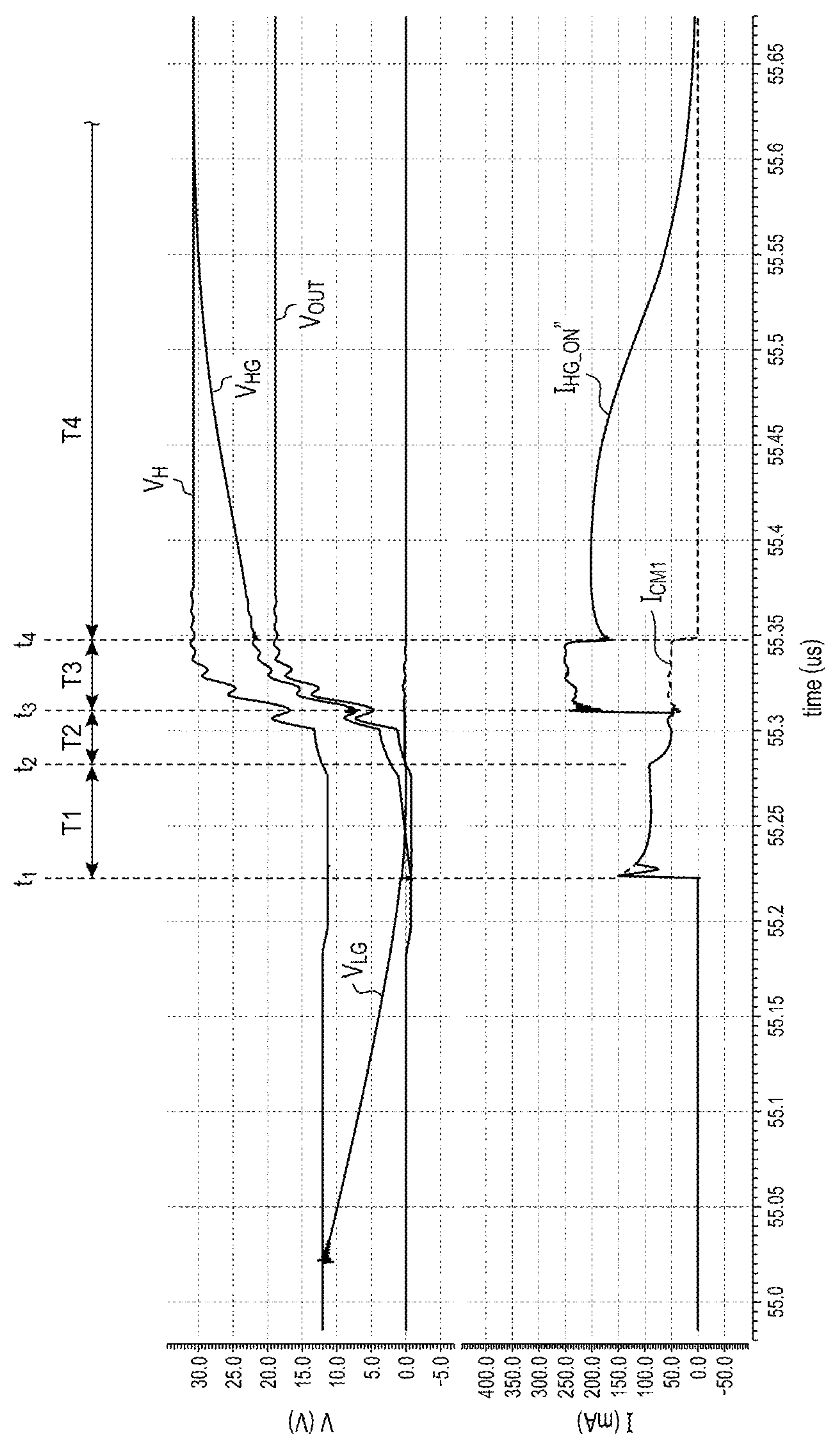
FIG. 9 is an operation waveform diagram of a drive circuit according to a second sequence modification.

FIG. 9 is an operation waveform diagram of the drive circuit 200 according to the second sequence modification. The upper part of FIG. 9 illustrates a voltage waveform in the second sequence modification. In the lower part of FIG. 9, a drive current $I_{HG\_ON}''$ in the second sequence modification is indicated by a solid line. A broken line $I_{CM1}$ indicates a component of the drive current $I_{HG\_ON}''$ supplied from the first current mirror circuit CM1. By fully turning on the on-fixing switch SW2 in the third period T3, the drive current $I_{HG\_ON}$ in the third period T3 can be further increased, and the turn-on time can be shortened.

Third Sequence Modification

The third sequence modification is a combination of the first sequence modification and the second sequence modification. In other words, the control circuit 210 turns on some of the transistors MP1 to MPn constituting the on-fixing switch SW2 in the first period T1. In the third period T3, the control circuit 210 brings the on-fixing switch SW2 into the full-ON state. Others are similar as in the embodiments.

Fourth Sequence Modification

In the embodiments or the first sequence modification to the third sequence modification, the first enable switch SW1 may also be turned off in the third period T3.

Applications

Next, applications of the switching circuit 100 will be described. The switching circuit 100 can be suitably used in a drive circuit of a motor.

Figure 10:
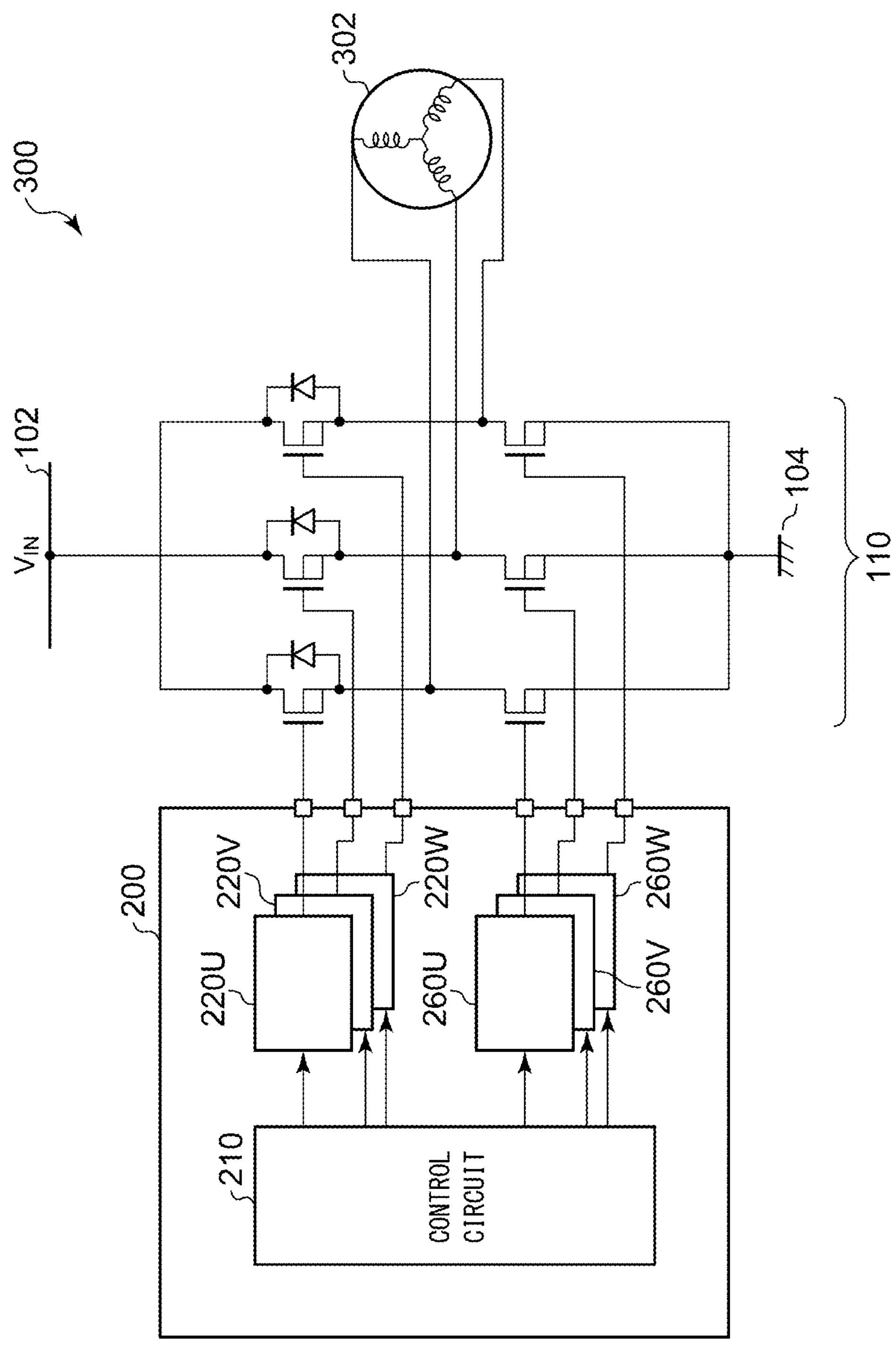
FIG. 10 is a circuit diagram of a motor-driving apparatus including the switching circuit according to an embodiment.

FIG. 10 is a circuit diagram of a motor-driving apparatus 300 including the switching circuit 100 according to an embodiment. The motor-driving apparatus 300 drives a three-phase motor 302, which is a load, and controls a rotation state.

The motor-driving apparatus 300 includes the bridge circuit 110 and the drive circuit 200. The bridge circuit 110 is a three-phase inverter and has legs of a U phase, a V phase, and a W phase, and the leg of each phase has an upper arm and a lower arm.

The drive circuit 200 includes the control circuit 210, high-side driver circuits 220U to 220W, and low-side driver circuits 260U to 260W. The control circuit 210 generates a control signal indicating states of six arms constituting the bridge circuit 110 based on a state of the three-phase motor 302 which is a load.

The high-side driver circuits 220U to 220W are configured by an architecture of the high-side driver circuit 220 described above. Further, the low-side driver circuits 260U to 260W are configured by an architecture of the low-side driver circuit 260 described above.

Here, the three-phase motor is taken as an example, but a single-phase motor may also be used. In this case, the bridge circuit 110 is an H-bridge circuit.

Next, applications of the motor-driving apparatus 300 will be described. The motor-driving apparatus 300 can be used for controlling a spindle motor of a hard disk and controlling a lens-driving motor of an imaging device. Alternatively, the motor-driving apparatus 300 can be used to drive a motor for driving a head of a printer or a motor for feeding paper. Alternatively, the motor-driving apparatus 300 can be used for driving a motor of an electric vehicle, a hybrid vehicle, or the like.

It is to be understood by a person skilled in the art that the embodiments are examples, various modifications can be made to combinations of respective components and respective processing processes, and such modifications also fall under the present disclosure or the scope of the present disclosure. Hereinafter, such modifications will be described.

First Modification

In the embodiments, the bridge circuit 110 is configured by a discrete component, but the present disclosure is not limited thereto, and the bridge circuit 110 may be integrated in the drive circuit 200.

Second Modification

The upper arm 112 and the lower arm 114 may include an insulated gate bipolar transistor (IGBT).

Third Modification

In the embodiments, both the high-side driver circuit 220 and the low-side driver circuit 260 are configured to be mode-selectable from a plurality of modes. However, only one of the high-side driver circuit and the low-side driver circuit may be configured to be mode-controllable.

Fourth Modification

In the embodiments, the first current mirror circuit CM1 can be switched to be enabled or disabled by the first enable switch SW1, but the present disclosure is not limited thereto. For example, the first enable switch SW1 may also be connected between a gate and a source of a PMOS transistor constituting the first current mirror circuit CM1, and the first current mirror circuit CM1 may also be disabled by turning on the first enable switch SW1. Alternatively, the first enable switch SW1 may be omitted. The second enable switch SW3 may also be omitted.

Fifth Modification

The applications of the switching circuit 100 are not limited to the motor-driving apparatus 300. For example, the switching circuit 100 can be suitably used for a switching regulator (DC/DC converter), various power conversion apparatuses (inverters and converters), an inverter for turning on a discharge lamp, a digital audio amplifier, and the like. Accordingly, the switching circuit 100 can be used in consumer equipment including electronic devices and home electric appliances, automobiles, in-vehicle components, industrial vehicles, and industrial machines.

The embodiments described using specific terms merely indicate the principle and applications of the present disclosure, and many modifications and changes in arrangement are recognized to pertain to the embodiments without departing from the spirit of the present disclosure defined in the claims.

Supplementary Note

The following techniques are disclosed in the description.

(Item 1)

A gate driver circuit structured to drive an N-type power transistor constituting a switching circuit, the gate driver circuit including:

a turn-on circuit structured to source an electric current to a gate of the power transistor;

a turn-off circuit structured to sink an electric current from the gate of the power transistor; and a control circuit structured to control the turn-on circuit and the turn-off circuit, in which the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period.

(Item 2)

The gate driver circuit according to item 1, in which an electric current supplied to the gate of the power transistor in the third period is larger than electric currents supplied to the gate of the power transistor in the first period and the second period.

(Item 3)

The gate driver circuit according to item 1 or 2, in which the on-fixing switch includes a plurality of transistors disposed on a plurality of parallel paths, and the number of the transistors in actions is variable.

(Item 4)

The gate driver circuit according to item 3, in which the control circuit turns on some of the plurality of transistors in the first period.

(Item 5)

The gate driver circuit according to item 3 or 4, in which the control circuit turns on all of the plurality of transistors in a fourth period following the third period.

(Item 6)

The gate driver circuit according to any one of items 1 to 5, further including a first enable switch connected between an output node of the first current mirror circuit and the gate of the power transistor.

(Item 7)

The gate driver circuit according to item 6, in which the control circuit turns on the first enable switch in the first period and the second period, and turns off the first enable switch in a fourth period following the third period.

(Item 8)

The gate driver circuit according to item 6 or 7, in which the control circuit turns on the first enable switch in the third period.

(Item 9)

The gate driver circuit according to item 6 or 7, in which the control circuit turns off the first enable switch in the third period.

(Item 10)

The gate driver circuit according to any one of items 1 to 9, in which the control circuit turns on the on-fixing switch in a fourth period following the third period.

(Item 11)

The gate driver circuit according to any one of items 1 to 10, in which the first current mirror circuit further has a second output node, and the turn-off circuit includes:

a second current mirror circuit having an input node to which the second output node of the first current mirror circuit is connected and an output node;

a second enable switch connected between the output node of the second current mirror circuit and the gate of the power transistor; and an off-fixing switch connected between the gate of the power transistor and a low-level line in which a low voltage equivalent to a low level of the gate voltage of the power transistor is generated.

(Item 12)

The gate driver circuit according to any one of items 1 to 11, in which the first current source includes:

an output node;

a first constant current circuit connected to the output node;

a first switch and a second constant current circuit connected in series between the output node and a ground; and a second switch and a third constant current circuit connected in series between an output of the second constant current circuit and the ground.

(Item 13)

The gate driver circuit according to any one of items 1 to 12, further including a first sensor structured to compare a gate-source voltage of the power transistor with a first threshold voltage, in which the control circuit shifts to the second period in response to a change in output of the first sensor in the first period.

(Item 14)

The gate driver circuit according to any one of items 1 to 13, further including a second sensor structured to compare an output voltage of the switching circuit with a second threshold voltage, in which the control circuit shifts to the third period in response to a change in output of the second sensor in the second period.

(Item 15)

The gate driver circuit according to item 5 or 7, further including a third sensor structured to compare an output voltage of the switching circuit with a third threshold voltage, in which the control circuit shifts to the fourth period in response to a change in output of the third sensor in the third period.

(Item 16)

The gate driver circuit according to any one of items 1 to 15, in which the gate driver circuit is integrally integrated on one semiconductor substrate.

(Item 17)

A motor-driving apparatus including:

a bridge circuit including a high-side transistor and a low-side transistor;

a high-side driver that is the gate driver circuit according to any one of items 1 to 16, the gate driver circuit being structured to drive the high-side transistor as the power transistor; and a low-side driver that is the gate driver circuit according to any one of items 1 to 16, the gate driver circuit being structured to drive the low-side transistor as the power transistor.

(Item 18)

An electronic device including:

a motor; and the motor-driving apparatus according to item 17, the motor-driving apparatus being structured to drive the motor.

What is claimed is:

1. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor; and a control circuit structured to control the turn-on circuit and the turn-off circuit, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein an electric current supplied to the gate of the power transistor in the third period is larger than electric currents supplied to the gate of the power transistor in the first period and the second period.

2. The gate driver circuit according to claim 1, further comprising a first enable switch connected between an output node of the first current mirror circuit and the gate of the power transistor.

3. The gate driver circuit according to claim 2, wherein the control circuit turns off the first enable switch in the third period.

4. The gate driver circuit according to claim 1, wherein the control circuit maintains ON-state of the on-fixing switch in a fourth period following the third period.

5. The gate driver circuit according to claim 1, wherein the first current mirror circuit further has a second output node, and the turn-off circuit includes:

a second current mirror circuit having an input node to which the second output node of the first current mirror circuit is connected and an output node;

a second enable switch connected between the output node of the second current mirror circuit and the gate of the power transistor; and an off-fixing switch connected between the gate of the power transistor and a low-level line in which a low voltage equivalent to a low level of the gate voltage of the power transistor is generated.

6. The gate driver circuit according to claim 1, wherein the gate driver circuit is integrally integrated on one semiconductor substrate.

7. A motor-driving apparatus comprising:

a bridge circuit including a high-side transistor and a low-side transistor;

a high-side driver that is the gate driver circuit according to claim 1, the gate driver circuit being structured to drive the high-side transistor as the power transistor; and a low-side driver that is the gate driver circuit according to claim 1, the gate driver circuit being structured to drive the low-side transistor as the power transistor.

8. An electronic device comprising:

a motor; and the motor-driving apparatus according to claim 7, the motor-driving apparatus being structured to drive the motor.

9. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor; and a control circuit structured to control the turn-on circuit and the turn-off circuit, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount, (ii) set the first current to the second current amount and turn off the on-fixing switch in a second period, and (iii) turn on the on-fixing switch in a third period, wherein the on-fixing switch includes a plurality of transistors disposed on a plurality of parallel paths, and the number of the transistors in actions is variable.

10. The gate driver circuit according to claim 9, wherein the control circuit turns on some of the plurality of transistors in the first period.

11. The gate driver circuit according to claim 9, wherein the control circuit turns on all of the plurality of transistors in a fourth period following the third period.

12. The gate driver circuit according to claim 11, further comprising a third sensor structured to compare an output voltage of the switching circuit with a third threshold voltage, wherein the control circuit shifts to the fourth period in response to a change in output of the third sensor in the third period.

13. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor;

a first enable switch connected between an output node of the first current mirror circuit and the gate of the power transistor; and a control circuit structured to control the turn-on circuit and the turn-off circuit, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein the control circuit turns on the first enable switch in the first period and the second period, and turns off the first enable switch in a fourth period following the third period.

14. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor;

a first enable switch connected between an output node of the first current mirror circuit and the gate of the power transistor; and a control circuit structured to control the turn-on circuit and the turn-off circuit, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein the control circuit turns on the first enable switch in the third period.

15. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor; and a control circuit structured to control the turn-on circuit and the turn-off circuit, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein the first current source includes:

an output node;

a first constant current circuit connected to the output node;

a first switch and a second constant current circuit connected in series between the output node and a ground; and a second switch and a third constant current circuit connected in series between an output of the second constant current circuit and the ground.

16. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor;

a control circuit structured to control the turn-on circuit and the turn-off circuit; and a first sensor structured to compare a gate-source voltage of the power transistor with a first threshold voltage, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein the control circuit shifts to the second period in response to a change in output of the first sensor in the first period.

17. A gate driver circuit structured to drive an N-type power transistor constituting a switching circuit, the gate driver circuit comprising:

a turn-on circuit structured to source an electric current to a gate of the power transistor;

a turn-off circuit structured to sink an electric current from the gate of the power transistor;

a control circuit structured to control the turn-on circuit and the turn-off circuit; and a second sensor structured to compare an output voltage of the switching circuit with a second threshold voltage, wherein the turn-on circuit includes:

a first current source structured to generate a first current switchable between a first current amount and a second current amount less than the first current amount;

a first current mirror circuit having an input node to which the first current source is connected, the first current mirror circuit being structured to fold and supply the first current to the gate of the power transistor; and an on-fixing switch connected between the gate of the power transistor and a high-level line in which a high voltage equivalent to a high level of a gate voltage of the power transistor is generated, the control circuit is configured to control the on-fixing switch and the first current source, and the control circuit is configured to, in response to an instruction to turn on the power transistor, (i) set the first current to the first current amount and turn off the on-fixing switch in a first period, (ii) set the first current to the second current amount and turn off the on-fixing switch in a second period, and (iii) turn on the on-fixing switch in a third period, wherein the control circuit shifts to the third period in response to a change in output of the second sensor in the second period.

* * * * *